United States Patent

Huber et al.

[11] Patent Number: 6,045,411
[45] Date of Patent: Apr. 4, 2000

[54] SWITCHING AND CONTROLLING ELECTRICAL DEVICE FOR A MOTOR VEHICLE

[75] Inventors: Elmar Huber, Stockhausen; Rolf Litzinger; Thomas Raica, both of Hechingen, all of Germany

[73] Assignee: Robert Bosch GmbH, Stuttgart, Germany

[21] Appl. No.: 09/125,184
[22] PCT Filed: Sep. 9, 1997
[86] PCT No.: PCT/DE97/01998
  § 371 Date: Aug. 12, 1998
  § 102(e) Date: Aug. 12, 1998
[87] PCT Pub. No.: WO98/28960
  PCT Pub. Date: Jul. 2, 1998

[30] Foreign Application Priority Data

Dec. 21, 1996 [DE] Germany ............... 196 53 831

[51] Int. Cl.[7] .................................. H01R 13/405
[52] U.S. Cl. ........................................... 439/736
[58] Field of Search ................... 439/695, 599, 439/712, 701, 724, 736; 29/883

[56] References Cited

U.S. PATENT DOCUMENTS

| | | | |
|---|---|---|---|
| 4,762,508 | 8/1988 | Tengler et al. | 439/607 |
| 4,772,230 | 9/1988 | Berg | 439/736 |
| 4,884,980 | 12/1989 | Bensing et al. | 439/606 |
| 5,021,012 | 6/1991 | Shibano | 439/610 |
| 5,605,478 | 2/1997 | Woodard | 439/695 |
| 5,699,233 | 12/1997 | Zlamal | 361/759 |
| 5,729,898 | 3/1998 | Ogawa | 29/883 |

FOREIGN PATENT DOCUMENTS

| | | |
|---|---|---|
| 0708583 | 4/1996 | European Pat. Off. . |
| 33 10 477 | 1/1984 | Germany . |
| 62-087314 | 4/1987 | Japan . |
| WO 93 14614 | 7/1993 | WIPO . |

*Primary Examiner*—Neil Abrams
*Assistant Examiner*—Hae Moon Hyeon
*Attorney, Agent, or Firm*—Kenyon & Kenyon

[57] ABSTRACT

An electrical device that is operationally reliable even under increased mechanical stresses, and which is cost-effective to manufacture. The device includes a recess on a housing for accommodating a plug-connector housing. The plug-connector housing is formed in that contact elements and a retaining element of the housing extending into the recess, as well as the segments of the housing bordering the recess, are introduced as insertion parts into a plastic injection molding die, and after the plastic injection process and the removal of the molding die, a plug-connector housing provided with contact elements is formed, fixedly positioned as an integral part on the housing of the device. The electrical device is preferably used in motor vehicles.

6 Claims, 1 Drawing Sheet

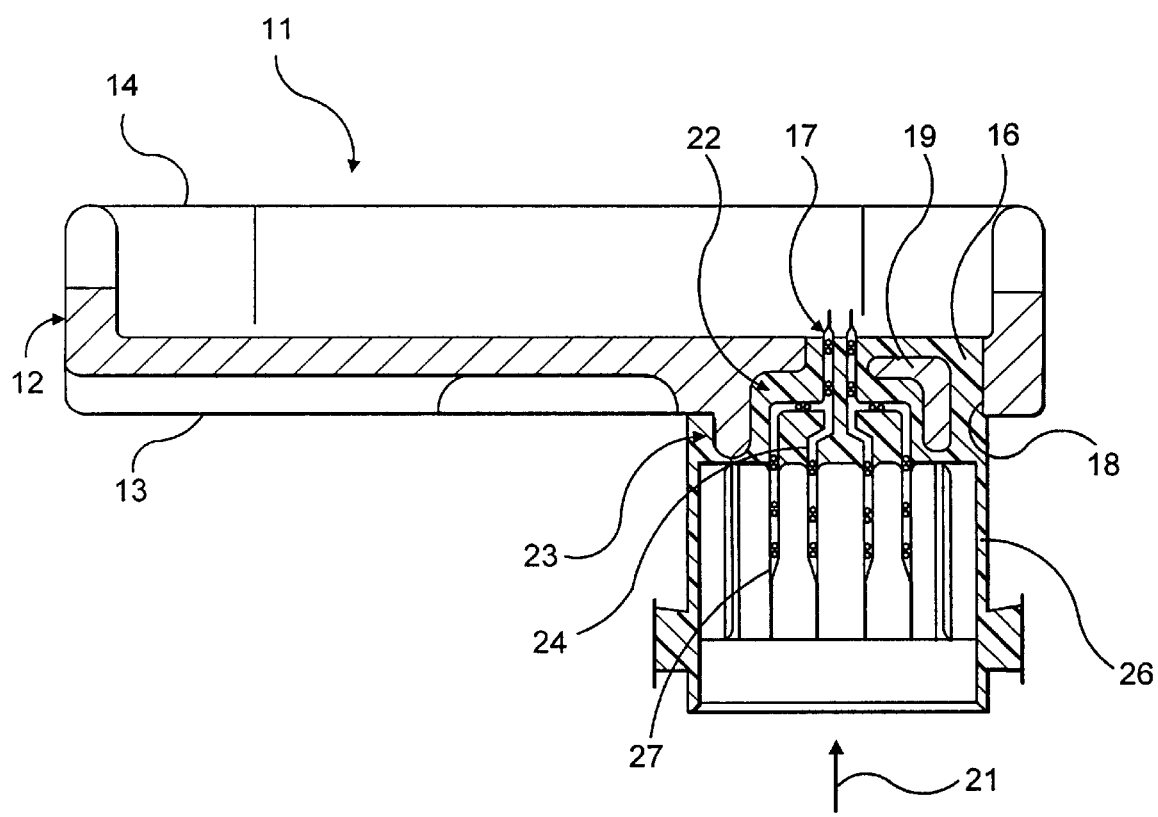

SWITCHING AND CONTROLLING ELECTRICAL DEVICE FOR A MOTOR VEHICLE

FIELD OF THE INVENTION

The present invention relates to an electrical device, in particular a switching and controlling device for a motor vehicle.

BACKGROUND INFORMATION

German Patent Application No. 1 33 10 477 A1 describes a device which includes a block-shaped housing, a component parts support located in the housing, a plug-in connector extending out of the housing at a front-end opening, and a frame-shaped retaining element, which surrounds the plug-in connector, overlapping it in part, and fixes it in position on the housing.

The plug-in connector represents a separate, replaceable part and includes a plug element made of plastic, in which support segments of contact elements are supported, the end segments of the contact elements constituting contact segments for coupling with mating contact elements of a mating connector and connector segments for connecting to the component parts support.

To be mounted on the device, the plug-in connector is attached to the retaining body using screws, and the retaining body to the housing of the device using snap-in connections. This manner of furnishing an electrical device with contact elements as a connecting means within the framework of a separate plug-in connector is unfavorable from a production engineering standpoint, and it is connected to high manufacturing costs. In particular, for such a device, the plug-in connectors must be constructed, inspected, and placed in intermediate storage. After the plug-in connector is conveyed to the device, the plug-in connector is attached to the device in assembly steps.

If the device is exposed to high mechanical stresses, for example, because it is mounted directly on an internal combustion engine of a motor vehicle, then additional reinforcing (safety) measures must be undertaken. For example, a reinforcing lacquer may be applied to the screw connections to prevent a shattering of the electrical connections between the connecting segments of the contact elements and the connecting points of the component parts support. This leads to the manufacturing process of the device being cost-intensive.

SUMMARY OF THE INVENTION

The electrical device of the present invention overcomes the above-described problems. In accordance with an exemplary embodiment of the present invention, a retaining element is mounted in a recess of a housing of the device, the retaining element extending into the recess transversely with respect to a coupling direction of contact elements of the device.

When a filling body is integrally inserted into the recess, the filling body closing the recess and having a positive fit with support segments of the contact elements and with the retaining part, a plug-connector housing is created which, as an integral component of the housing of the electrical device, gives the device a high degree of operational reliability even under increased mechanical stresses, and makes possible a cost-effective manufacturing process of the device.

BRIEF DESCRIPTION OF THE DRAWING

The FIGURE illustrates a sectional view of an exemplary embodiment of the present invention, and, in particular, the FIGURE shows parts of a housing and of a plug-connector housing of an electrical device.

DETAILED DESCRIPTION OF THE INVENTION

As shown in the FIGURE, an electrical device 11, in particular a switching and controlling device for a motor vehicle, includes a housing 12, which is block-shaped and is made of metal. Alternatively, the housing may also be manufactured out of plastic.

A component parts support (not shown) is located in housing 12, the component parts support being fitted with electrical and/or electronic components and having electrical connecting points for connection.

On a base 13 of housing 12, opposite a top surface 14 of housing 12, a recess 16 or, alternatively, a plurality of recesses 16 is formed. The recess may be closed using a cover. Recess 16 is provided for accommodating contact elements 17, which are connected to end-side connecting segments having associated connecting points of the component parts support. The shape of recess 16 is a function of the arrangement of contact elements 17; if the arrangement is configured in rows, recess 16 has the shape of an elongated hole.

On an inner wall 18 of recess 16, a retaining element 19 is formed as part of housing 12. Retaining element 19, in the shape of a frame (bar), extends into recess 16 at a right angle to a coupling direction of contact elements 17, along an arrow 21.

Using plastic injection, a filling body 22 can be introduced into recess 16 to create a plug-connector housing 23 having a positive fit. For this purpose, contact elements 17, retaining element 19, and the segments of housing 12 that border on recess 16 are inserted as insertion parts into a plastic injection molding die (in a manner not illustrated).

In the plastic injection process, support segments 24 of contact elements 17 and retaining element 19 are enclosed in plastic, which encounters a boundary surface of housing 12 at inner wall 18.

After the removal of the plastic injection molding die, plug-connector housing 23, which is provided with contact elements 17, is formed as an integral part of housing 12 of electrical device 11. Plug-connector housing 23, in which contact elements 17 are fixedly supported via support segments 24, is, for its part, an immovable part of housing 12 as a result of including retaining element 19 and of abutting inner wall 18.

Plug-connector housing 23 has a collar-shaped receptacle 26, projecting from housing 12, in which receptacle contact segments 27 of contact elements 17 are arranged for coupling with mating contact elements of a mating connector.

When plug-connector 23 is formed by a plastic injection process, components such as cable exits, screw-on- and heat-contact surfaces, mechanical protective elements, and spaces for accommodating electrical switches can be formed on plug-connector 23 in a simple manner.

As a result of integrating, as described above, plug-connector housing 23 into housing 12 of electrical device 11, the mechanical stability between housing 12, in which the component parts support is mounted, and plug-connector housing 23, which supports the contacting to the outside, is so great that connecting elements between the connecting segments of contacting elements 17 and connecting points of the component parts support, such as bonds, flexible films, or cables, are not damaged despite high stress from shaking.

In this way, an electrical device 11 is possible which has great operational reliability along with being cost-effective to manufacture.

What is claimed is:

1. A switching and controlling electrical device for a motor vehicle, comprising:
   - a device housing having a recess, the device housing having an inner wall forming the recess;
   - a contact element arranged in the device housing and including a support segment, the contact element providing an electrical connection in a first direction;
   - a retaining element formed on the inner wall and extending into the recess in a second direction transverse to the first direction; and
   - a filling body integrally introduced into the recess forming a plug-connector housing, the filling body filling the recess and fitting positively with the support segment and the retaining element.

2. The electrical device according to claim 1, wherein the retaining element is coupled to at least a part of the device housing.

3. The electrical device according to claim 2, wherein the filling body is formed of plastic.

4. The electrical device according to claim 3, wherein the filling body is formed by inserting at least a portion of the device housing and the support segment into an injection molding die and injecting the plastic into the recess.

5. The electrical device according to claim 4, wherein the filling body forms a mating connector housing.

6. The electrical device according to claim 1, wherein the filling body encloses the retaining element.

* * * * *